(12) United States Patent
Naru et al.

(10) Patent No.: US 11,239,851 B2
(45) Date of Patent: Feb. 1, 2022

(54) GAIN CORRECTION FOR MULTI-BIT SUCCESSIVE-APPROXIMATION REGISTER

(71) Applicant: TEXAS INSTRUMENTS INCORPORATED, Dallas, TX (US)

(72) Inventors: Srinivas Kumar Reddy Naru, Bengaluru (IN); Anand Jerry George, Calicut (IN); Shagun Dusad, Bengaluru (IN); Visvesvaraya Appala Pentakota, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/997,975

(22) Filed: Aug. 20, 2020

(65) Prior Publication Data

US 2020/0382128 A1     Dec. 3, 2020

Related U.S. Application Data

(63) Continuation of application No. 16/221,323, filed on Dec. 14, 2018, now Pat. No. 10,790,841.

(30) Foreign Application Priority Data

Oct. 31, 2018   (IN) .............................. 201841041188

(51) Int. Cl.
| | |
|---|---|
| *H03M 1/00* | (2006.01) |
| *H03M 1/06* | (2006.01) |
| *H03M 1/12* | (2006.01) |
| *H03M 1/46* | (2006.01) |
| *H03M 1/10* | (2006.01) |
| *H03M 1/18* | (2006.01) |

(52) U.S. Cl.
CPC ....... *H03M 1/0604* (2013.01); *H03M 1/1245* (2013.01); *H03M 1/468* (2013.01); *H03M 1/00* (2013.01); *H03M 1/001* (2013.01); *H03M 1/10* (2013.01); *H03M 1/12* (2013.01); *H03M 1/18* (2013.01)

(58) Field of Classification Search
CPC .......... H03M 1/18; H03M 1/12; H03M 1/001; H03M 1/10; H03M 1/00
USPC ......................... 341/139, 155, 110, 120, 163
See application file for complete search history.

(56) References Cited

U.S. PATENT DOCUMENTS

| | | | |
|---|---|---|---|
| 6,894,627 B2 | 5/2005 | Janakiraman et al. | |
| 7,916,063 B1* | 3/2011 | Portmann | ............. H03M 1/466 341/163 |
| 8,754,794 B1* | 6/2014 | Li | ....................... H03M 1/1057 341/120 |

(Continued)

*Primary Examiner* — Joseph J Lauture
(74) *Attorney, Agent, or Firm* — Valerie M. Davis; Charles A. Brill; Frank D. Cimino

(57) ABSTRACT

A system has a digital-to-analog converter; a reference signal coupled to the digital-to-analog converter; a differential amplifier for applying gain, and for generating output signals as a function of sampled input signals, the reference signal, digital codes, and the gain applied by the differential amplifier coupled to the digital-to-analog converter; and a multi-bit successive-approximation register for determining the digital codes in successive stages coupled to the differential amplifier; and the gain applied by the differential amplifier is corrected based on previously determined digital codes.

18 Claims, 2 Drawing Sheets

(56) References Cited

U.S. PATENT DOCUMENTS

| | | | |
|---|---|---|---|
| 8,933,830 B1* | 1/2015 | Jeon | H03M 1/1023 |
| | | | 341/110 |
| 9,391,627 B1 | 7/2016 | Srinivasa et al. | |
| 2005/0219097 A1* | 10/2005 | Atriss | H03M 1/162 |
| | | | 341/144 |
| 2006/0208933 A1* | 9/2006 | Chen | H03M 1/1038 |
| | | | 341/120 |
| 2011/0215857 A1* | 9/2011 | Nonin | H03L 5/00 |
| | | | 327/307 |
| 2016/0336952 A1 | 11/2016 | Srinivasa et al. | |

* cited by examiner

US 11,239,851 B2

GAIN CORRECTION FOR MULTI-BIT SUCCESSIVE-APPROXIMATION REGISTER

CROSS REFERENCE TO RELATED APPLICATIONS

This continuation application claims priority to U.S. patent application Ser. No. 16/221,323, filed Dec. 14, 2018, which application claims priority to India provisional Patent Application No. 201841041188, filed Oct. 31, 2018, both of which are incorporated herein by reference in their entirety.

BACKGROUND

An analog-to-digital (A/D) converter (ADC) may be used to generate digital codes which represent the level of an analog signal. An analog-to-digital converter may be configured to operate in an iterative, multi-stage fashion, using a successive-approximation register (SAR) and a digital-to-analog (D/A) converter (DAC). An analog-to-digital converter which uses a successive-approximation register to develop a sequence of digital codes is referred to herein as a successive-approximation register analog-to-digital converter.

A digital-to-analog converter for a successive-approximation register analog-to-digital converter may have one or more capacitor arrays, as illustrated, for example, in U.S. Pat. No. 6,894,627 and United States Patent Application Publication No. 2016/0336952. The one or more capacitor arrays may be operationally controlled by approximation codes that are developed by the successive-approximation register. The entire disclosures of U.S. Pat. No. 6,894,627 and United States Patent Application Publication No. 2016/0336952 are hereby fully incorporated herein by reference.

SUMMARY

This disclosure relates to a system which has a digital-to-analog converter; a reference signal coupled to the digital-to-analog converter; a differential amplifier for applying gain, and for generating output signals as a function of sampled input signals, the reference signal, digital codes, and the gain applied by the differential amplifier coupled to the digital-to-analog converter; and a multi-bit successive-approximation register for determining the digital codes in successive stages coupled to the differential amplifier; and wherein the gain applied by the differential amplifier is corrected based on previously determined digital codes.

This disclosure also relates to a method of digitizing an analog signal. The method includes: (A) sampling a first input voltage; (B) using a capacitor array and an amplifier to generate first output voltages for successive stages as a function of (1) the first input voltage, (2) a reference voltage, and (3) first digital approximation codes, and using a multi-bit successive-approximation register analog-to-digital converter to determine the codes; (C) subsequently, sampling a second input voltage, and using the capacitor array and the amplifier to generate second output voltages for successive stages as a function of (1) the second input voltage, (2) a reference voltage, and (3) second digital approximation codes, and using the analog-to-digital converter to determine the second digital approximation codes; (D) correcting gains of the amplifier based on previously determined digital approximation codes; and (E) using the first and second digital approximation codes to generate digital output signals corresponding to the first and second input voltages, respectively.

DETAILED DESCRIPTION

Figure 1:
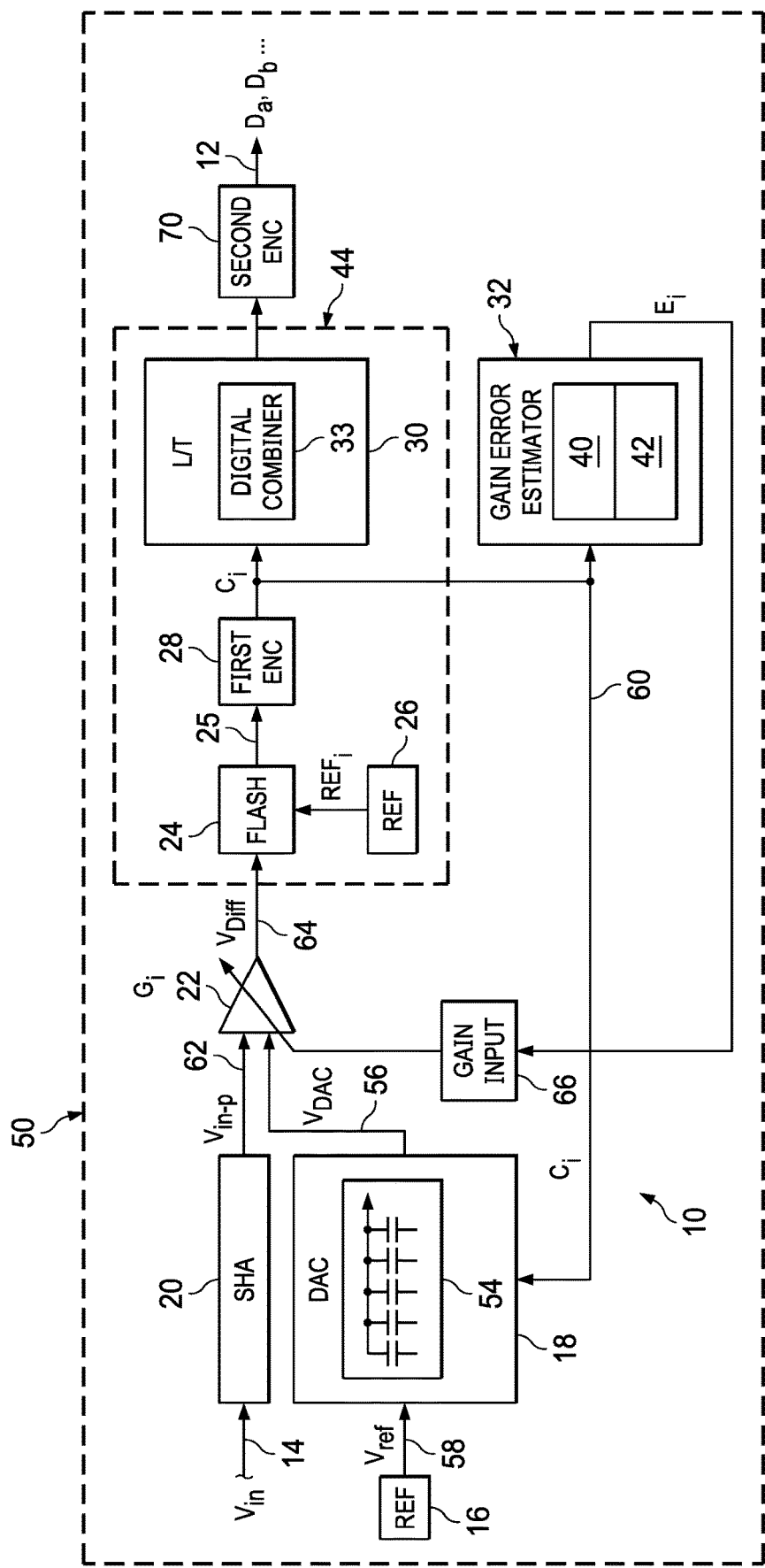
FIG. 1 is a block diagram of a multi-bit successive-approximation register analog-to-digital converter system constructed in accordance with one example of this disclosure.

Referring now to the drawings, where like reference numerals designate like elements and steps, there is shown in FIG. 1 a successive-approximation register analog-to-digital converter system 10 for generating binary digital codes $D_a$, $D_b$ . . . , and for outputting the codes $D_a$, $D_b$ . . . on an output line 12. The output codes $D_a$, $D_b$ . . . are examples of "output signals" in accordance with this disclosure. In the illustrated configuration, the output codes $D_a$, $D_b$ . . . are digital representations of sampled voltages $V_{in}$ on an analog input line 14. The system 10 is an example of a system for digitizing sampled input values: for each sampled voltage $V_{in}$, the analog-to-digital converter system 10 operates through N successive stages to determine a single output code $D_a$, $D_b$ . . . .

The analog-to-digital converter system 10 has a first reference source 16, a digital-to-analog converter 18, a sample-and-hold amplifier (SHA) 20, a variable-gain differential amplifier 22 for generating output voltages, a multi-bit flash-type analog-to-digital converter 24, a second reference source 26, a first encoder 28, a logic and timing circuit 30, and a gain-error estimation circuit 32. The logic and timing circuit 30 has a digital combiner circuit 33. In the illustrated example, the gain-error estimation circuit 32 has a state machine 40 and logic circuitry 42. This disclosure is not limited, however, to the specific implementation shown in the drawings and described herein. In the illustrated example, the analog-to-digital converter 24, the first encoder 28, and the logic and timing circuit 30 are elements of a successive-approximation register 44.

All of the components of the analog-to-digital converter system 10 may be connected to or integrated into an integrated circuit (IC) and/or a chip 50 fabricated according to various semiconductor and/or other processes. One or more of the conductive lines 12, 14 and other devices and elements 18, 32, 44 of the analog-to-digital converter system 10 may be diffused or implanted into one or more layers of semiconductor material (not illustrated). The integrated devices and elements 18, 32, 44 include transistors, resistors, and other suitable electronic devices that are not shown in the drawings for the sake of clarity.

The digital to-analog converter 18 has a capacitor array 54 which is operated, in each of the N successive stages, in response to respective digital, thermometric approximation codes $C_i$, where i=0, 1 N−1. In each stage, according to timing determined by the logic and timing circuit 30, the capacitor array 54 generates a comparison voltage $V_{DAC}$ on a reference comparison line 56. As illustrated in FIG. 1, the differential amplifier 22 is coupled to the digital-to-analog converter 18 by the comparison line 56. In each stage, the comparison voltage $V_{DAC}$ is functionally related to (1) a reference voltage $V_{ref}$ applied by the first reference source 16 on a first reference line 58 and (2) the digital approximation code $C_i$ previously communicated to the capacitor array 54 on a code input line 60 at the beginning of the stage. The reference voltage $V_{ref}$ is an example of a "reference signal" in accordance with this disclosure, and is coupled to the digital-to-analog converter 18 by the first reference line 58. In the illustrated example, the first reference line 58 is electrically conductive, is connected to the digital-to-analog converter 18, and, in operation, supplies the reference signal to the digital-to-analog converter 18. In the illustrated example, reference comparison line 56 is electrically conductive, is connected to the differential amplifier 22, and, in operation, supplies a signal (the comparison voltage $V_{DAC}$ in the illustrated example) from the digital-to-analog converter 18 to the differential amplifier 22. Because the approximation code $C_i$ changes from stage to stage, the comparison voltage $V_{DAC}$ also changes from stage to stage. The comparison voltage $V_{DAC}$ is an example of a "comparison signal" in accordance with this disclosure.

This disclosure may be implemented in a variety of configurations and is not limited to the details illustrated in the drawings or mentioned herein. For example, this disclosure is not necessarily limited to any particular capacitor array. Arrays having different numbers of capacitors of different characteristics, with or without capacitor arrays split by a coupling capacitor, and/or configured in different ways relative to the reference voltage $V_{ref}$, may be employed with other elements to achieve advantages over the prior art in line with this disclosure. Moreover, by way of example, this disclosure may be implemented with a current-steering digital-to-analog converter, without any capacitor array.

Moreover, although the illustrated capacitor array 54 is operated under the control of the thermometric approximation codes $C_i$, where each code $C_i$ includes M digital values $(D_1, D_2 \ldots D_M)$ for M capacitors, an alternative system in accordance with this disclosure may have binary capacitors operated under the control of binary approximation codes. In general, for this disclosure, the manner in which the approximation codes are determined by a successive-approximation register system may be implemented in various configurations.

Figure 2:
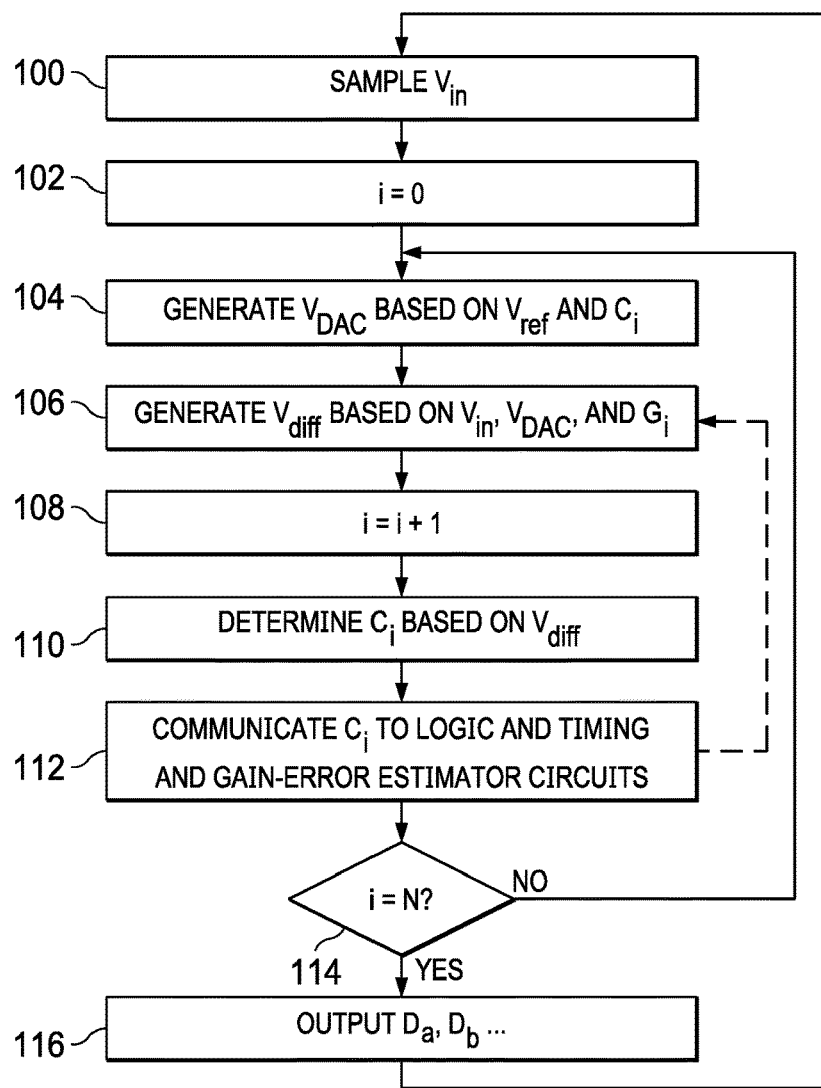
FIG. 2 is a flowchart for a method of operating the analog-to-digital converter system of FIG. 1.

In operation, before a first stage begins, and according to timing controlled by the logic and timing circuit 30, the sample and hold amplifier 20 samples the voltage $V_{in}$ on the input line 14 (Step 100, FIG. 2). The sample and hold amplifier 20 (FIG. 1) thereafter maintains a proportional voltage $V_{in-p}$ (proportional to the sampled voltage $V_{in}$) on an input comparison line 62, and thereby applies the proportional voltage $V_{in-p}$ to one of the inputs of the differential amplifier 22. The proportional voltage $V_{in-p}$ continues to be applied to the first input of the amplifier 22 from at least the beginning of the first stage (when i=0) until at least the beginning of a last stage (when i=N−1).

The comparison voltage $V_{DAC}$ is applied to the second input of the differential amplifier 22 via the reference comparison line 56, and the differential amplifier 22 outputs a differential voltage $V_{diff}$ on a differential line 64. As illustrated in FIG. 1, the register 44 is coupled to the differential amplifier 22 by the differential line 64. In the illustrated example, the differential line 64 is electrically conductive, is connected to the analog-to-digital converter 24 of the register 44, and, in operation, transmits the output signals (the differential voltages $V_{diff}$ in the illustrated example) from the differential amplifier 22 to the analog-to-digital converter 24. The differential voltage $V_{diff}$ for the i-th stage is a function of (1) the difference between the proportional voltage $V_{in-p}$ and the comparison voltage $V_{DAC}$ generated during that stage and (2) a variable gain $G_i$ applied by the amplifier 22 (Step 106). Each gain $G_i$ is the sum of a predetermined gain for the i-th stage and a correction gain $E_i$. In the example described herein, the predetermined, desired gains follow a predefined and fixed sequence for each conversion, and the correction values are estimated within the gain-error estimation circuit 32 using previously determined digital codes.

The predetermined gains, which are different for each stage, are stored in the logic and timing circuit 30. The correction gain $E_i$ is determined by the gain-error estimation circuit 32 for each stage as described in more detail below. For each stage, the predetermined gain for that stage is applied to the amplifier 22 by the logic and timing circuit 30 by a suitable device (not shown), and the correction gain $E_i$ is applied to the amplifier 22 by a suitable input device 66 which receives signals from the gain-error estimation circuit 32.

For each stage of the illustrated system 10, the differential voltage $V_{diff}$ is applied to the flash-type analog-to-digital converter 24 via the differential line 64. In the illustrated example, the analog-to-digital converter 24 has cascading high-speed comparators (not illustrated), and, via the first encoder 28, generates the thermometric approximation codes $C_i$ that are applied to the capacitors of the array 54. The differential voltage $V_{diff}$ is an example of a "differential voltage signal" in accordance with this disclosure.

A reference $REF_i$ that is applied to the converter 24 may vary from stage to stage under the control and timing of the logic and timing circuit 30. In general, the reference $REF_i$ to the flash-type analog-to-digital converter 24 is scaled for successive stages, under the control of the logic and timing circuit 30. In each stage, the first encoder 28 receives the output of the converter 24 (that is, a flash code via a line 25) and uses the output to generate the respective approximation code $C_i$ (Step 110). The converter 24 is an example of a "flash device" in accordance with this disclosure.

For any i-th cycle, the actual value X of the differential voltage $V_{diff}$ is unknown, such that the effective residue $R_i$ in the system 10 ($R_i = X - \Sigma_{k=0}^{i} C_k$) is also unknown. In general, however, the effective residue $R_i$ is the portion of the differential voltage $V_{diff}$ that is not resolved by the successive-approximation register 44 till the i-th stage. The unresolved portion (the effective residue $R_i$) is resolved (within the limits of the ultimate resolution of the system 10) during the stages that follow the i-th stage. Thus, for any i-th stage, the effective residue $R_i$ ($= X - \Sigma_{k=0}^{i} C_k$) can be assumed to be equal to the sum of the approximation codes $C_k$ for the stages that follow the i-th stage (that is, where k=i+1, i+2 ... N−1), as follows:

$$R_i = X - \sum_{k=0}^{i} C_k = \sum_{k=i+1}^{N-1} C_k$$

Figure 3:
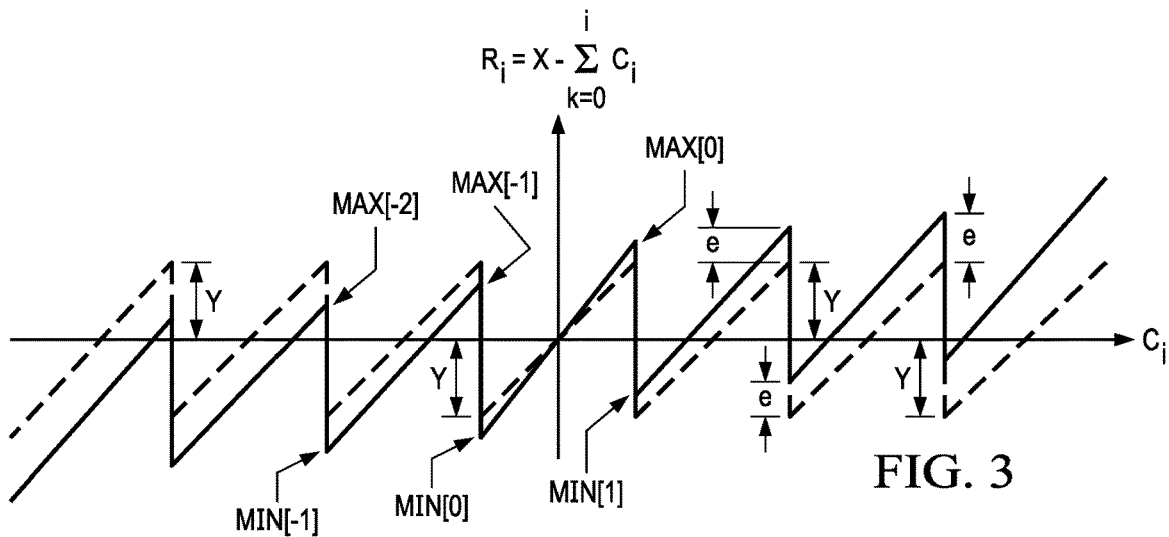
FIG. 3 is a graph of effective residue values $(X - \Sigma_{k=0}^{i} C_k)$ as a function of approximation code values $C_i$.

The expected performance of an ideal successive-approximation register analog-to-digital converter system is represented by a dashed line in FIG. 3. The ideal converter is one in which the actual gains applied by a differential amplifier are the same as the desired, predetermined gains for the differential amplifier. For the ideal converter system, for any value of $C_i$, the effective residue $R_i$ ($= X - \Sigma_{k=0}^{i} C_k$) is within a nominal range±Y. In other words, the effective residue $R_i$ is never greater than or less than a nominal value Y.

Moreover, the expected performance for the ideal converter is statistically symmetrical, such that the average effective residue $R_i$ equals zero. When $C_i = 0$, the effective residue values $R_i$ are between −Y and Y, and the average of those values is zero. Likewise, when $C_i$=−1, the effective residue values $R_i$ are between −Y and Y, and the average of those values is zero. The slope of a straight line that is statistically fitted to the symmetrical accumulated performance curve of the ideal converter (the dashed line in FIG. 3) is zero.

The accumulated performance of a less-than-ideal successive-approximation register analog-to-digital converter system is represented by a solid line in FIG. 3. The less-than-ideal converter is one in which the actual gains applied by a differential amplifier are not the same as the desired, predetermined gains for the differential amplifier. For the less-than-ideal converter, for any value of $C_i$, the effective residue $R_i$ (=X−$\Sigma_{k=0}^{i} C_k$) sometimes exceeds the nominal range±Y by a gain-error value e, and the effective residue $R_i$ is sometimes greater than or less than the nominal values−Y, Y.

Further, the accumulated performance for the less-than-ideal converter is not statistically symmetrical; the average effective residue $R_i$ does not equal zero. When $C_i$=0, the effective residue values $R_i$ are between MIN[0] (<−Y) and MAX[0] (>Y), but the average of those values is still zero. As the absolute value of $C_i$ increases, the midpoint between the corresponding maximum and minimum effective residues $R_i$ diverges more and more from the respective ideal value. For example, when $C_i$=−1, the corresponding effective residue values $R_i$ are between MIN[−1] (<−Y) and MAX[−1] (>Y), and the average of those values is less than zero (for a positive gain error). Therefore, the difference between the less-than-ideal converter system and the ideal system (that is, the gain-error value) can be quantified most clearly in connection with approximation codes $C_i$ having the greatest absolute values.

For each stage of the less-than-ideal converter system, the slope of a straight line that is statistically fitted to the asymmetrical accumulated performance curve is a non-zero value which is proportional to an estimated gain error $\hat{E}_i$, and can be statistically determined as follows: First, statistical values MAX, MIN, and MID are collected and defined as follows:

$$MAX[k] = \max_{(C_i==k)} R_i$$

The slope of the line which passes through MID[k] is proportional to and thereby can be used to determine an estimated value of the gain error $\hat{E}_i$, as follows:

$$\hat{E}_i \propto \{MID[p]-MID[-p]\} MID[k]=(MAX[k]+MIN[k+1])/2$$

where $\hat{E}_i$ is the statistically-determined gain error for the i-th cycle, and p denotes the maximum approximation code $C_i$ for the i-th cycle. As indicated above, as the absolute value of $C_i$ increases, the midpoint between the corresponding maximum and minimum effective residues $R_i$ diverges more and more from the ideal value. Therefore, the difference between the less-than-ideal converter system and the ideal system (that is, the gain-error value) can be quantified most clearly in connection with approximation codes $C_i$ that have the greatest absolute values.

Then, the accuracy of the estimated gain error $\hat{E}_i$ is refined by a suitable gradient descent algorithm, such as the following:

$$\hat{E}_i[n+1]=\hat{E}_i[n]+\alpha*\{MID[p]-MID[-p]\}$$

where $\hat{E}_i[n]$ is the gain error estimated in a previous iteration, $\hat{E}_i[n+1]$ is the gain error estimated in a next iteration, α is a suitable learning rate, and {MID[p]−MID[−p]} is the slope of the line which passes through MID[k] as mentioned above.

Referring now again to FIG. 2, as previously indicated, the input voltage $V_{in}$ is first sampled (Step 100) before the first stage (i=0). (The first stage begins after Step 102.) During the first stage, the comparison voltage $V_{DAC}$ is established on line 56 based on $V_{ref}$ and $C_0$ (Step 104). At the beginning of the first stage, $C_0$ may be, for example, ½ of the reference voltage $V_{ref}$. Then, a differential voltage $V_{diff}$ is established on line 64 based on the proportional voltage $V_{in-p}$, the comparison voltage $V_{DAC}$, and a suitable gain $G_0$ applied to the differential amplifier 22 under the control of the logic and timing circuit (or block) 30 and the gain input device 66, which is controlled by the gain-error estimation circuit (or block) 32 (Step 106).

Then, continuing in the first stage (Step 108), a new approximation code $C_1$ is determined by the successive-approximation register 44, based on the differential voltage $V_{diff}$ (Step 110). The new approximation code $C_1$ is communicated to the logic and timing and gain-error estimation circuits 30, 32 and the capacitor array 54, and is stored within the state machine 40 and logic circuitry 42 of the gain-error estimation circuit 32 (Step 112).

Subsequently, the process proceeds through the second through N-th stages (repeating "No" from Step 114, followed by Steps 104, 106, 108, 110, 112 for each stage) until N approximation codes $C_i$ have been determined by the successive-approximation register 44. At that point ("Yes" from Step 114), an output code $D_a$, $D_b$ . . . is determined by a second encoder 70 (FIG. 1) and outputted on line 12, and the process returns (Step 100, FIG. 2) to sample a new input voltage $V_{in}$ to obtain a corresponding new output code $D_a$, $D_b$ . . . .

Each approximation code $C_i$ determined each time a sampled voltage $V_{in}$ is digitized is stored by the gain-error estimation circuit 32. The approximation codes $C_i$ provide statistical data that are used to estimate gain errors $E_i$ within the system 10, as explained above. For each stage of each analog-to-digital conversion performed by the system 10, the statistically determined gain error $E_i$ is applied (66) to the amplifier 22 such that the gain error $E_i$ is effectively subtracted from the predetermined gain for the respective stage, so that the operation of the system 10 approximates that of an ideal analog-to-digital converter system. In other words, the digital approximation codes $C_i$ are used to generate gain-error correction values $E_i$ for controlling the amplifier 22.

The gain $G_i$ of the differential amplifier 22 is advantageously adjusted before each multi-level comparison (that is, for each stage), but the gain correction process is performed in the background as represented by the broken line in FIG. 2. Every approximation code $C_i$ determined for every sampled voltage $V_{in}$, over a predetermined time, is accumulated within the gain-error estimation circuit 32 (Step 112), where the accumulated data is statistically processed and the estimated gain error $E_i$ is used to control (correct) gains $G_i$ for successive conversions of sampled voltages $V_{in}$ (Steps 106, 108, 110).

The system 10 is well adapted for low-power applications, and because the system 10 converts multiple bits in each cycle, it can operate at high speed. The system described herein may be used, if desired, to perform low power 18/16 bit, 65 mega-samples per second (MSPS), analog-to-digital conversions, but may be scaled to lower sampling rates. The system 10 may also be used, if desired, to support 14 bit, 125 mega-samples per second, analog-to-digital conversions. To determine the gain errors $E_i$, approximation codes $C_i$ for a series of analog-to-digital conversions are accumulated in the gain-error estimation circuit 32 for a suitable period of time, such as, for example, one microsecond. This disclosure should not be limited, however, to the particular features of the examples described herein.

According to this disclosure, an ideal amplifier gain is optimally predetermined for each stage of the conversion cycle, and any deviation in the actual gain from the designed or ideal value may lead to less than optimal performance. Therefore, it is desirable to correct for any such gain error. Although the gain error potentially could be addressed by using an over range and allocating error correction cycles, those approaches may not be fully satisfactory. Including one or more extra stages may result in higher power consumption and slower operation, and therefore may be less than satisfactory. Factory trimming of gain values for the amplifier may be unsatisfactory because it does not provide for tracking of gain variations over time, and hence disadvantageous over-design may be required if factory trimming is the only approach employed.

This disclosure advantageously utilizes a process that operates in the background (within the gain-error estimation circuit 32) to correct for gain errors. Although the gain-error estimation circuit 32 may rely on timing signals from the logic and timing circuit 30, the variable input data for the process (if desired, essentially the only data input into and processed by the gain-error estimation circuit 32) are the sequentially generated approximation codes $C_i$. Due to the background nature of the process, voltage and temperature variations and other gain errors can be corrected for in real time, if desired, while the system 10 is operating.

As noted above, this disclosure is not limited to the details of the illustrated system 10 shown in the drawings. In an alternative system constructed in accordance with this disclosure, for example, the logic and timing and gain-error estimation circuits 30, 32 may have one or more suitable processors, memories, and/or clock generators. Also, for example, other gradient descent algorithms besides the one described specifically above, and other processing steps and elements, may be used to calculate gain-error values $E_i$ for correcting the gain of the amplifier 22 in real time.

What have been described above are examples. This disclosure is intended to embrace alterations, modifications, and variations to the subject matter described herein that fall within the scope of this application, including the appended claims. As used herein, the term "includes" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed as new and desired to be protected by Letters Patent of the United States is:

1. A circuit comprising:
  a differential amplifier having first and second amplifier inputs, an amplifier output, and a gain correction input;
  a successive-approximation register coupled to the amplifier output, the successive-approximation register including:
    an analog-to-digital converter coupled to the amplifier output; and
    an encoder coupled to the analog-to-digital converter and having a digital code output; and
  gain correction circuitry having: an input coupled to the digital code output; and an output coupled to the gain correction input of the differential amplifier, the gain correction circuitry configured to:
    receive a digital code from the encoder; and
    determine a gain correction value using the digital code, the gain correction value to adjust a gain of the differential amplifier.

2. The circuit of claim 1, wherein the differential amplifier, the successive-approximation register, and the gain correction circuitry are included on a same integrated circuit.

3. The circuit of claim 1, further comprising a digital-to-analog converter having: a first input coupled to the digital code output of the encoder; a second input; and a respective output coupled to the first amplifier input.

4. The circuit of claim 3, wherein the digital-to-analog converter is configured to:
  receive a reference signal at its second input and the digital code at its first input; and
  provide a comparison signal at its output, the comparison signal is based on the reference signal and the digital code.

5. The circuit of claim 4, wherein the digital-to-analog converter includes a capacitor array configured to be controlled by the digital code to generate the comparison signal using the reference signal.

6. The circuit of claim 3, further comprising a sample-and-hold circuit having a respective output coupled to the second amplifier input.

7. The circuit of claim 1, wherein the successive-approximation register further includes:
  circuitry coupled to the encoder and configured to provide a gain value to be combined with the gain correction value to adjust the gain of the differential amplifier.

8. The circuit of claim 1, wherein the analog-to-digital converter includes cascading comparators.

9. A method comprising:
  receiving a sample of an analog voltage and receiving a first comparison signal into an amplifier;
  generating an amplifier output signal by the amplifier based on the sample of the analog voltage, the first comparison signal, and a gain of the amplifier;
  generating a digital approximation code in a successive-approximation register using the amplifier output signal;
  generating an output digital code using the digital approximation code, the output digital code representing the sample of the analog voltage;
  determining a gain adjustment value using the digital approximation code;
  adjusting the gain of the amplifier based on the gain adjustment value; and
  generating a second comparison signal using the digital approximation code.

10. The method of claim 9, wherein the output signal is a first output signal and the gain adjustment value is a first gain adjustment value, the method further comprising:
  receiving the sample of the analog voltage and receiving the second comparison signal into the amplifier;
  generating a second amplifier output signal by the amplifier based on the sample of the analog voltage, the second comparison signal, and the gain of the amplifier adjusted by the first gain adjustment value;
  generating a second digital approximation code in the successive-approximation register using the second amplifier output signal;

generating the output digital code using the second digital approximation code;

determining a second gain adjustment value using the second digital approximation code; and adjusting the gain of the amplifier based on the second gain adjustment value.

11. The method of claim 9, further comprising adding the gain adjustment value to a known gain value to adjust the gain of the amplifier.

12. The method of claim 9, further comprising determining a difference between the sample of the analog signal and the comparison signal and applying the gain to the difference to generate the amplifier output signal.

13. A circuit comprising:
a differential amplifier having first and second amplifier inputs, an amplifier output, and a gain correction input;
a successive-approximation register coupled to the amplifier output and having a digital code output;
a digital-to-analog converter having: a first input coupled to the digital code output of the successive-approximation register; a second input; and an output coupled to the first amplifier input;
a sample-and-hold circuit having a respective output coupled to the second amplifier input; and
gain correction circuitry having: a respective input coupled to the digital code output of the successive-approximation register; and a respective output coupled to the gain correction input of the differential amplifier, the gain correction circuitry configured to:
receive a digital code from the successive-approximation register; and
determine a gain correction value using the digital code, the gain correction value to adjust a gain of the differential amplifier.

14. The circuit of claim 13, wherein the digital-to-analog converter includes a capacitor array.

15. The circuit of claim 14, wherein the digital-to-analog converter is configured to:
receive a reference signal at its second input and the digital code at its first input; and
generate a comparison signal at its output using the capacitor array, wherein the comparison signal is generated using the reference signal and the digital code.

16. The circuit of claim 13, wherein the successive-approximation register includes:
an analog-to-digital converter coupled to the amplifier output; and
an encoder coupled to the analog-to-digital converter, the encoder is configured to generate the digital code at the digital code output.

17. The circuit of claim 16, wherein the successive-approximation register further includes:
circuitry coupled to the encoder and configured to provide a gain value to be combined with the gain correction value to adjust the gain of the differential amplifier.

18. The circuit of claim 16, wherein the analog-to-digital converter includes cascading comparators.

* * * * *